June 28, 1960 A. S. ROSE 2,943,005

METHOD OF ALLOYING SEMICONDUCTOR MATERIAL

Filed Jan. 17, 1957

INVENTOR.
ARNOLD S. ROSE
BY J. C. Whittaker
ATTORNEY

United States Patent Office 2,943,005
Patented June 28, 1960

2,943,005

METHOD OF ALLOYING SEMICONDUCTOR MATERIAL

Arnold S. Rose, Plainfield, N.J., assignor to Radio Corporation of America, a corporation of Delaware Filed Jan. 17, 1957, Ser. No. 634,668

8 Claims. (Cl. 148—1.5)

This invention relates to improved semiconductor devices and improved methods of making them. More particularly, it relates to improved methods of making surface alloyed junctions of controlled size and quality.

Semiconductor devices such as crystal diodes and transistors may be fabricated by the method known as the surface alloy process. The method comprises positioning a pellet or dot of conductivity type-determining electrode material on a major surface of a monocrystalline semiconductive wafer. The conductivity type of the wafer is opposite to that induced by the pellet. The wafer-pellet assembly is then heated to a temperature sufficient to melt the pellet, but not so high as to melt or injure the crystal lattice structure of the wafer. The electrode material selected must have a melting point appreciably lower than that of the wafer. During the alloying step the pellet melts, spreads over the surface of the wafer, and dissolves some of the wafer material. On cooling, the solute or dissolved portion of the wafer is first to recrystallize from the melt, since it has a higher melting point than the solvent or molten pellet. The dissolved wafer material tends to recrystallize in the same lattice as the undissolved bulk of the wafer, so that the wafer remains monocrystalline. However, this recrystallized portion of the wafer contains sufficient pellet material to change the conductivity type of the zone, so that the recrystallized region is of conductivity type opposite to that of the wafer. The interface between the recrystallized zone and the remainder of the wafer is known as the alloy front. Since the interface is the boundary between a P-conductivity type region and an N-conductivity type region, a rectifying barrier known as a P-N junction is formed at the alloy front.

Several difficulties are encountered in the utilization of the surface alloy technique. Two important problems are the tendency of electrode pellets to spread excessively and irregularly over the surface of the wafer during alloying, and the tendency of the molten electrode to wet the wafer unevenly. These problems are particularly pertinent in the production of alloy junction transistors, wherein an emitter electrode pellet or dot is surface alloyed to one face of a semiconductor base wafer and a collector electrode pellet or dot is coaxially alloyed to the opposite face of the wafer. In such devices it is desirable to keep the capacitance of the collector junction constant. Since capacitance is proportional to area, or radius squared, a small change in dot radius makes a large change in capacitance. To avoid such changes, and insure a uniform product, dot spreading must be controlled. Excessive dot spreading may also cause a short circuit to the base electrode. This problem is aggravated if semi-conductors having a substantially perfect lattice structure are used. Such materials have fewer edge dislocations per unit volume and, although it is desirable to use these improved materials for certain reasons, it has been found htat these improved materials cause increased dot spreading.

Another serious problem arises in the surface alloy method when the molten electrode pellets wet the semiconductor wafer in an uneven manner, so as to leave dry "islands" of the wafer scattered through the alloyed area. Since the molten pellet does not dissolve the wafer in these islands or unwet areas, the emitter and collector rectifying barriers formed have irregular surfaces. The operating efficiency of each P-N barrier is reduced, since only a portion of each junction area has been converted to opposite conductivity type so as to be electronically active. Furthermore, since the two alloy fronts become irregular instead of parallel, electric charge carriers emitted from different portions of the emitter barrier have different minimum diffusion paths through the base wafer to the collector. As the speed of the charge carriers in the semiconductor base wafer is finite, this variation in minimum distance travelled by the charge carriers tends to limit the frequency response of the transistor and to distort any impressed signal. It is therefore desirable to fabricate surface alloyed semiconductor devices by a method which will prevent excessive dot spreading and will produce rectifying barriers that are substantially uniform, flat, and parallel with respect to each other.

Accordingly, an object of the instant invention is to provide improved methods of surface alloying.

Another object is to provide improved methods of making surface alloyed rectifying barriers in semiconductor bodies.

Still another object is to provide improved methods of fabricating surface alloyed semiconductor devices having electrode dots of controlled and uniform size.

Yet another object is to provide improved semiconductor devices having substantially uniform and planar rectifying barriers of relatively large area.

These and other objects are accomplished by the instant invention according to which rectifying barriers are formed within semiconductor wafers by the preliminary step of first heating the wafer and the electrode dot separately in an active ambient atmosphere selected to react with and remove surface impurities and moisture before the step of surface alloying the electrode pellet to the wafer.

The invention will be explained in greater detail in connection with the accompanying drawings, in which.

Similar reference characters have been applied to similar elements throughout the drawing.

Figure 1:
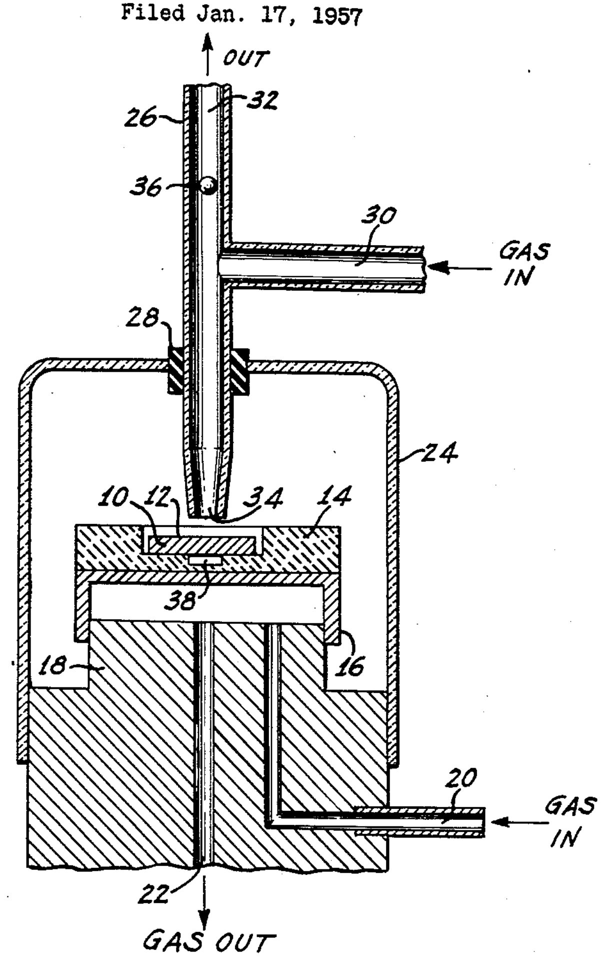
Figure 1 is a schematic view of an apparatus for making P-N junctions in accordance with the present invention.

The term monatomic will be used hereafter to denote materials consisting of a single atomic species. The term monatomic semiconductor denotes semiconductive elements, and is generic to germanium and silicon.

It is known that optimum electrical characteristics are obtained when alloy junction devices are fabricated from semiconductor crystals having a minimum of edge dislocations. Crystal imperfections are small regions where the regular pattern of the crystal breaks down and some atoms are not properly surrounded by neighbors. Edge dislocations are one class of the imperfections in the structure of a crystal in which one plane of atoms slips partly over another plane, and the slip vector is at right angles to the dislocation. See chapters 1 and 2 of "Dislocations in Crystals" by W. T. Read, McGraw-Hill Book Company, Inc., New York, 1953. Germanium normally used for making semiconductor devices has from 1,000 to 10,000 edge dislocations per cm.². However, monocrystalline germanium can now be produced which has as low as 100 to 800 edge dislocations per cm.$^2$. Excessive and erratic spreading of the impurity dot occurs during alloying when semiconductive material with low edge dislocation density (0 to 800 per cm.$^2$) is used.

It was unexpectedly found that the presence of edge dislocations inhibits the lateral spread of indium pellets on germanium wafers during the alloying process. The use of germanium or silicon with a high edge dislocation density for the purpose of reducing lateral dot spreading is not the most desirable solution, because it tends to introduce unsatisfactory electrical characteristics, such as raising the collector saturation current, and reducing the collector breaddown voltage.

It has also been found that incomplete wetting in surface alloyed junctions is caused by the presence of films of moisture, semiconductor oxides, and other impurities on the surface of the monatomic wafer and the electrode pellet. When alloy junction units are made using clean, oxide film-free, and dry wafers and pellets, it is observed that the junctions are uniform. Sectioning such units reveals that the molten pellet has wet the entire surface covered by it, so that the junctions formed are planar and contain no islands or unwet areas.

The present invention provides for the control of the degree of dot spreading and the degree of wetting of a surface alloyed P–N junction by means of a two-stage process in which the impurity dot, for example indium, and the monatomic wafer, for example N-conductivity type germanium, are first preheated separately in an active ambient atmosphere to a temperature sufficient to remove the film of impurities on the surface of the dot and the wafer. When alloying indium pellets to germanium wafers, a reducing ambient atmosphere should be used. For example, forming gas at a temperature of 300° C. will remove moisture, oxides, and other impurities from the surface of both the germanium wafer and the indium pellet. The pellet is then positioned on a major surface of the wafer, and is alloyed to the wafer by heating the assembly in the same ambient atmosphere of forming gas to a temperature of about 550° C. An embodiment illustrative of one method of carrying out the invention will be described, using as an example a junction triode transistor of the type discussed generally by Law et al. in "A Developmental Germanium P–N–P Junction Transistor," Proceedings of the IRE, November 1952.

Referring to Figure 1 of the drawing, a monocrystalline wafer 10 of N-conductivity type germanium is prepared so that one major surface 12 is substantially parallel to the (111) crystal plane. The wafer 10 is positioned with surface 12 uppermost on a graphite hearth 14 resting on a heating element 16. The heating element 16 may for example be made of any resistance alloy, and is seated on a furnace base 18 which may for example be brass or steel. The furnace base 18 contains a gas inlet channel 20 and a gas outlet 22. A glass envelope 24 covers the base 18 and the assembly. A glass dropping tube 26 held by a rubber washer 28 passes vertically through the center of the envelope 24, and is positioned so that its nozzle 34 is over the center of the wafer 10. The tube 26 is provided with a gas inlet 30 and an outlet 32.

The wafer 10 is heated to about 300° C. by passing a hot stream of forming gas through inlet 20 and outlet 22. The forming gas stream is a mixture of 90 nitrogen–10 hydrogen by volume, and serves a dual purpose. First, it sweeps all the oxygen and water vapor out of the apparatus. Second, the hydrogen reduces the film of germanium oxide and other impurities on the surface 12 of the wafer 10, so that pure dry germanium is exposed. While the wafer 10 is being preheated, an electrode pellet 36, for example an .010 inch diameter sphere, is dropped down tube 26 and is suspended in the tube by the pressure of the forming gas entering the tube 26 by means of inlet 30 inside the apparatus. The electrode pellet 36 may be pure indium, or a predominantly indium alloy. For example, the indium may be alloyed with 1 to 5 percent germanium by weight, or with 0.5 to 2 percent zinc by weight, or, if improved emitter efficiency is desired, with 0.5 to 2 percent aluminum or .05 to 0.2 percent gallium by weight. The pellet 36 is preheated to about 300° C. by passing a stream of hot forming gas through inlet 30 and outlet 32. The surface of the pellet 36 is thereby cleaned by the removal of films of moisture and indium oxide. The progressive cleaning may be readily observed, since the surface of the pellet 36 changes from dull and cloudy to a uniformly bright metallic luster. The preheating temperature for the wafer 10 and pellet 36 is not critical, and may be varied from 250° C. to 350° C.

The flow of forming gas into inlet 20 is next reduced or halted. The pressure of the gas inside the envelope 24 is thereby reduced so that the pellet 36, which is now bright and clean, falls on the center of the surface 12 of wafer 10. The pellet 36 is then alloyed to the wafer 10. The alloying is accomplished in the forming gas atmosphere by energizing the heating element 16 to raise the temperature of the wafer and pellet to about 550° C. The hydrogen present acts as a flux and promotes the wetting of the germanium wafer 10 by the pellet 36, which melts at about 300° C. and assumes a characteristic hemispherical shape. The temperature of 550° C. is maintained for about 3 minutes, but this period is not critical and may be extended to 30 minutes without harm. During this time the molten pellet dissolves a portion of the germanium wafer. The amount of germanium that molten indium will dissolve depends upon the temperature of the melt. At 550° C., the melt consists of approximately 91 percent indium and 9 percent germanium by weight.

The temperature of the apparatus is then lowered, so that the molten indium pellet 36 freezes. As the melt cools, the solubility of germanium in the melt decreases. At 400° C., the melt can dissolve only about 3 percent germanium by weight. Since the melt contained about 9 percent germanium at 550° C., two-thirds of the dissolved germanium will precipitate out of the melt when the temperature falls to 400° C. Under equilibrium conditions, the surface of the solid germanium wafer in contact with the molten pellet acts as a seed for the recrystallizing germanium, and all of the latter will grow upon this surface. If this seed surface is monocrystalline, the regrown germanium will continue the original lattice structure and will be monocrystalline. On further cooling, the remainder of the dissolved germanium precipitates. When the temperature falls to 155° C., the melt is essentially pure indium which freezes at this temperature.

Figure 2:
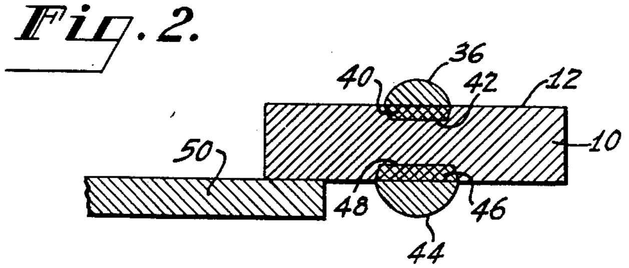
Figure 2 is a sectional view of an improved junction transistor made by the method of this invention.

Referring to Figure 2, the indium pellet 36 is thus alloyed to the surface 12 of the wafer 10. Although the pellet 36 may originally be in the shape of a sphere or a disc, surface tension forces cause the alloyed pellet to have a characteristic hemispherical shape. Immediately below the pellet 36 is the wafer region 40 which was dissolved by the melt and then recrystallized on cooling. The region 40 contains sufficient dissolved indium to change its conductivity to P-type. At the front of the alloyed portion 40 is the interface 42 between the P-type zone 40 and the N-type bulk of the wafer. The interface 42 forms a rectifying barrier, and is usually called a P–N junction.

If a crystal diode is desired, one P-N junction is sufficient. Ohmic lead wires (not shown) are attached to the wafer 10 and the electrode 36, and the unit is mounted and encapsulated by any of the conventional methods known to the art. If a junction triode is desired, the wafer 10 is turned in the graphite hearth 14 so that the surface 12 is at the bottom. The hearth 14 contains a central well 38 into which the electrode 36 fits, thus centering the wafer. The process is repeated with a slightly larger pellet 44, as it has been found advantageous to have the collector electrode larger than the emitter. Another recrystallized P-type zone 46 is thus formed, and a second P-N junction 48. The two junctions 42 and 48 are parallel, flat, and uniform. To complete the transistor, the wafer 10 is ohmically soldered to a base tab 50, which may for example be nickel. Lead wires (not shown) are attached to the emitter electrode 36, the collector electrode 40, and the base tab 50. The unit is then conventionally mounted and encapsulated. For a more complete discussion of transistors and their fabrication, see "Transistors I," RCA Laboratories, Princeton, New Jersey, 1956.

Semiconductor devices made by this method have extremely uniform flat junctions, and do not exhibit any unwet areas at the alloy front. In addition, the spreading of the indium pellet is reproducibly controlled. Using .010 inch indium spheres as in this example, the average final diameter of the pellet after alloying is .015 inch. Without this technique, spreading is considerably greater, and the diameter of the alloyed pellet may be as high as .040 inch on low dislocation density germanium.

It is believed that the incomplete alloying and the unwetted areas found in surface alloyed junctions are caused by gaseous porosity at the pellet-wafer interface. The source of this porosity is the presence of impurity films, including oxides and moisture, on both pellet and wafer. The method of this invention avoids porosity at the junction interface by removing the intervening impurity films, resulting in the elimination of gas bubbles and unwet areas. The excessive and uncontrolled spreading of small impurity dots over the surface of low dislocation density monatomic wafers has been observed, and is attributed to the relative inability of the molten dot to penetrate into the closely packed (111) crystal planes parallel to the wafer surface as against alloying in the (110) direction, which is perpendicular to the wafer surface. This occurs with normal alloying practice where the dot is contacted to the wafer at room temperature and heated slowly to the alloying temperature. The instant invention avoids excessive dot spreading by preheating wafer and dot separately to a temperature of at least about 300° C., before they are contacted, which results in more uniform alloying both in the direction parallel to the wafer surface and the direction normal to the surface.

The invention is not limited to the particular materials described above. The method is equally applicable to donor electrode pellets, for example 90 lead–10 antimony, on P-type germanium wafers, so as to produce N-P-N transistors. The method may also be practiced with silicon as the semiconductor wafer. In air and in aqueous solutions, silicon always has its surface covered with a thin impervious film of silicon dioxide, which cannot be wetted by liquid metals. Since silicon dioxide is not reduced by hydrogen, an ambient atmosphere of forming gas is not effective for cleaning silicon. Silicon dioxide is readily attacked by fluorine, forming silicon fluoride, which passes off as a gas. Hence, when silicon wafers are alloyed by the method of this invention, an atmosphere of 98 argon–2 fluorine by volume is passed into the inlet tube 20 during the preheating of the wafer. The impurity pellet may be preheated in an atmosphere of forming gas, or in a 98 argon–2 fluorine ambient. When silicon wafers are used instead of germanium, higher temperatures are required for the alloying step. For example, when N-conductivity type silicon wafers are employed, a suitable P-conductivity type material for the electrode pellet is aluminum. Preheating of the wafer and pellet may be performed at a temperature of about 400° C., and the alloying of the pellet to the wafer accomplished at 700° C. If P-conductivity type silicon wafers are utilized, a suitable N-conductivity type material for the electrode dot is an alloy of 99 gold-1 antimony, with preheating at about 300° C., and alloying performed at about 700° C.

There have thus been described improved methods of making crystalline semiconductive devices with improved uniform rectifying barriers and more uniform electrical characteristics.

What is claimed is:

1. The method of making semiconductor devices comprising separately preheating a monatomic semiconductive wafer and an electrode pellet containing conductivity type-determining material in a reducing atmosphere to a temperature sufficient to remove surface impurities therefrom, contacting said pellet to a major surface of said wafer while both pellet and wafer remain in the preheated state and in said atmosphere, and further heating said pellet and wafer in said atmosphere to a temperature at which said pellet is alloyed to said wafer.

2. The method of making semiconductor devices comprising separately preheating a germanium wafer and an indium electrode pellet in a reducing atmosphere to a temperature sufficient to remove surface impurities therefrom, contacting said pellet to a major surface of said wafer while both pellet and wafer remain in the preheated state in said atmosphere, and further heating said pellet and wafer in said atmosphere to alloy said pellet to said wafer.

3. The method of making semiconductor devices comprising separately preheating an N-conductivity type germanium wafer and an indium electrode pellet in a 90 nitrogen–10 hydrogen by volume atmopshere to a temperature sufficient to remove surface impurities therefrom, contacting said pellet to a major surface of said wafer while both pellet and wafer remain in the preheated state in said atmosphere, and heating said pellet and wafer in said atmosphere to alloy said pellet to said wafer.

4. The method of making semiconductor devices comprising separately preheating an N-conductivity type germanium wafer and an indium electrode pellet in a 90 nitrogen–10 hydrogen by volume atmosphere to a temperature of about 300° C., contacting said pellet to a major surface of said wafer in said atmosphere at about 300° C., and further heating said pellet and wafer in said atmosphere to a temperature of about 550° C.

5. The method of making semiconductor devices comprising separately preheating a P-conductivity type germanium wafer and a 90 lead–10 antimony electrode pellet in a 90 nitrogen–10 hydrogen by volume atmosphere to a temperature of about 300° C., contacting said pellet to a major surface of said wafer in said atmosphere at about 300° C., and further heating said pellet and wafer in said atmosphere to a temperature of about 500° C. to alloy said pellet to said wafer.

6. The method of making semiconductor devices comprising separately preheating a silicon wafer and an electrode pellet containing conductivity type-determining material in a fluorine containing atmosphere to a temperature sufficient to remove impurities from surface therefrom, contacting said pellet to a major surface of said wafer while both pellet and wafer remain in the preheted state in said atmosphere, and further heating said pellet and wafer in said atmosphere to alloy said pellet to said wafer.

7. The method of making semiconductor devices comprising separately preheating a P-conductivity type silicon wafer and a 99 gold–1 antimony electrode pellet in a reducing atmosphere to about 300° C., contacting said pellet to a major surface of said wafer in said atmosphere at a temperature of about 300° C., and further heating said pellet and wafer in said atmosphere to a temperature of about 700° C.

8. The method of making semiconductor devices comprising preheating an N-conductivity type silicon wafer and an aluminum electrode pellet in a reducing atmosphere to a temperature of about 400° C., contacting said pellet to a major surface of said wafer in said atmosphere at about 400° C., and further heating said pellet and wafer in said 98 atmosphere to a temperature of about 700° C. to alloy said pellet to said wafer.

References Cited in the file of this patent

UNITED STATES PATENTS

| | | |
|---|---|---|
| 2,575,324 | Pearson | July 31, 1956 |
| 2,731,704 | Spanos | Jan. 24, 1956 |
| 2,756,483 | Wood | July 31, 1956 |
| 2,796,368 | Jenny | June 18, 1957 |
| 2,805,968 | Dunn | Sept. 10, 1957 |
| 2,825,667 | Mueller | Mar. 4, 1958 |
| 2,830,920 | Colson et al. | Apr. 15, 1958 |
| 2,850,412 | Dawson et al. | Sept. 2, 1958 |
| 2,857,296 | Farris | Oct. 21, 1958 |

OTHER REFERENCES

Electronics, October 1953, pages 131–135 (page 134 relied on).